(12) United States Patent
Ogura et al.

(10) Patent No.: US 6,660,811 B2
(45) Date of Patent: Dec. 9, 2003

(54) EPOXY RESIN COMPOSITION AND CURING PRODUCT THEREOF

(75) Inventors: Ichiro Ogura, Chiba (JP); Yoshiyuki Takahashi, Chiba (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 0 days.

(21) Appl. No.: 10/059,045

(22) Filed: Jan. 30, 2002

(65) Prior Publication Data

US 2002/0156189 A1 Oct. 24, 2002

(30) Foreign Application Priority Data

Jan. 30, 2001 (JP) .................................... P. 2001-021754

(51) Int. Cl.[7] ............................................... C08L 63/04
(52) U.S. Cl. .......................... 525/523; 528/98; 549/543
(58) Field of Search ........................... 528/98; 525/523; 549/543

(56) References Cited

U.S. PATENT DOCUMENTS 5,478,871 A * 12/1995 Takebe ....................... 523/443

FOREIGN PATENT DOCUMENTS

JP 2000-1524 1/2000

OTHER PUBLICATIONS

J. Grant ed, Hachh's Chem. Dictionary, McGraw–Hill p 536, 1974.*

* cited by examiner

*Primary Examiner*—Robert Dawson
*Assistant Examiner*—D. Aylward
(74) *Attorney, Agent, or Firm*—Armstrong, Kratz, Quintos, Hanson & Brooks, LLP

(57) ABSTRACT

An epoxy resin composition comprising: (i) an epoxy resin having a melt viscosity of from 0.1 dPa to 5 dPa at 150° C. and having two or more repeating units each comprising: a methylene bond substituted by at least an aromatic ring; and a benzene ring substituted by at least a glycidyloxy group, wherein said aromatic ring is at least one member selected from the group consisting of (a) condensed aromatic rings and (b) combinations of aromatic rings in which two or more aromatic monocycles or condensed aromatic rings are connected directly to each other via a single bond; and (ii) a curing agent.

7 Claims, No Drawings

EPOXY RESIN COMPOSITION AND CURING PRODUCT THEREOF

FIELD OF THE INVENTION

The present invention relates to an epoxy resin composition which is excellent in flame retardance and which is suitably used as a semiconductor-sealing material or a printed circuit board material.

BACKGROUND OF THE INVENTION

An epoxy resin can be cured with various curing agents to form a cured product normally excellent in mechanical properties, humidity resistance, chemical resistance, heat resistance, electrical properties, etc. Thus, an epoxy resin finds wide application to electronic materials and molding materials. An epoxy resin to be used in the art of electronic materials such as printed wiring circuit board essentially comprises a halogen compound incorporated therein to render these materials flame retardant. In recent years, however, a halogen-based flame retardant has been considered problematic as a dioxin-producing factor from the standpoint of environmental protection. Thus, it has been keenly desired to provide a halogen-free flame retardant epoxy resin material. In the art of semiconductor-sealing material, as the semiconductor surface packaging process has spread, the solder crack resistance of the semiconductor package has become an important factor. A conventional semiconductor-sealing material comprising a cresol-novolac type epoxy resin and a phenol-novolac resin in combination exhibits an excellent heat resistance but is disadvantageous in that it exhibits a poor humidity resistance and hence a deteriorated solder crack resistance.

Referring to the method for solving these problems, Japanese Patent Laid-Open No. 2000-1524 discloses a technique involving the use of an epoxy resin having a specific molecular structure that meets the requirements for humidity resistance. The invention of the above cited Japanese Patent Laid-Open No. 2000-1524 can provide a cured product excellent in humidity resistance but is poor in flame retardance, which is required in the art of electronic material. Further, the epoxy resin described in Japanese Patent Laid-Open No. 2000-1524 is bifunctional and thus cannot increase in its crosslinking density. Thus, the foregoing epoxy resin exhibits a deteriorated heat resistance and leaves something to be desired in the improvement of solder crack resistance.

SUMMARY OF THE INVENTION

It is therefore an object of the invention to provide a flame retardant epoxy resin material which is excellent in flame retardance as well as in heat resistance despite halogen-free composition.

Other objects and effects of the present invention will become apparent from the following description.

Under these circumstances, the inventors made extensive studies seeking epoxy resin compositions which give cured products excellent in flame retardance as well as in heat resistance. As a result, it was found that the foregoing requirements can be satisfied by an epoxy resin composition comprising: a novel epoxy resin having two or more repeating units each comprising a methylene bond substituted by at least an aromatic ring and a benzene ring substituted by at least a glycidyloxy group, the aromatic ring being at least one member selected from the group consisting of (a) condensed aromatic rings and (b) combinations of aromatic rings in which two or more aromatic monocycles or condensed aromatic rings are connected directly to each other via a single bond; and a curing agent. The invention has thus been worked out.

The invention has been worked out on the basis of the foregoing technical knowledge. That is, the invention provides an epoxy resin composition comprising:

(i) an epoxy resin having a melt viscosity of from 0.1 dPa to 5 dPa at 150° C. and having two or more repeating units each comprising:
   a methylene bond substituted by at least an aromatic ring; and
   a benzene ring substituted by at least a glycidyloxy group,
   wherein the aromatic ring is at least one member selected from the group consisting of (a) condensed aromatic rings and (b) combinations of aromatic rings in which two or more aromatic monocycles or condensed aromatic rings are connected directly to each other via a single bond; and (ii) a curing agent.

DETAILED DESCRIPTION OF THE INVENTION

The epoxy resin to be incorporated in the epoxy resin composition according to the invention has a melt viscosity of from 0.1 dPa to 5 dPa at 150° C. and has two or more repeating units each comprising a methylene bond substituted by at least an aromatic ring and a benzene ring substituted by at least a glycidyloxy group, wherein the aromatic ring is at least one member selected from the group consisting of (a) condensed aromatic rings and (b) combinations of aromatic rings in which two or more aromatic monocycles or condensed aromatic rings are connected directly to each other via a single bond.

Examples of the condensed aromatic ring (a) include condensed rings such as naphthalene, fluorene, acenaphthacene, indene, anthracene, pyrene, chrysene and triphenylene.

Examples of the combinations of aromatic rings (b), in which two or more aromatic monocycles or condensed aromatic rings are connected directly to each other via a single bond, include structures having aromatic monocycles connected directly to each other via a single bond, such as biphenyl and p-terphenyl; structures comprising an aromatic hyrocarbon having two or more independent benzene rings, such as phenyl methyl phenyl, phenoxyphenyl, bibenzylyl and stilbenyl; and structures in which functional groups having hydrocarbon skeletons of condensed rings, such as indenyl, naphthyl, anthryl and phenanthryl, are connected to each other.

Preferred among the above-exemplified aromatic rings are biphenyl group, p-terphenyl group, phenoxyphenyl group, bibenzylyl group, indenyl group, naphthyl group, anthryl group, and phenanthryl group. Furthermore, functional groups having a hydrocarbon skeleton having a condensed ring such as biphenyl group, p-terphenyl group, phenoxyphenyl group, indenyl group, naphthyl group, anthryl group and phenanthryl group are preferred because they provide a resin excellent in flame retardance. Biphenyl group and naphthyl group are particularly preferred.

To the foregoing benzene ring that is substituted by at least a glycidyloxy group may be connected a group other than glycidyloxy group, such as $C_1$–$C_6$ alkyl group, $C_5$–$C_6$ cycloalkyl group, $C_1$–$C_6$ alkoxyl group, $C_5$–$C_6$ cycloalkoxyl, phenyl, phenoxy or glycidyloxyphenyl group as a substituent.

Examples of the epoxy resin include those having a structure represented by the following general formula (1):

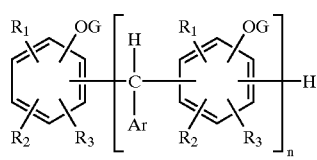

(1)

wherein $R_1$ to $R_3$ may be the same or different and each represent a hydrogen atom, a $C_1$–$C_6$ alkyl group, a $C_5$–$C_6$ cycloalkyl group, a $C_1$–$C_6$ alkoxyl group, a $C_5$–$C_6$ cycloalkoxyl group, a phenyl group, a phenoxy group or a glycidyloxyphenyl group; Ar represents a hydrocarbon group having a member selected from the group consisting of $C_6$–$C_{18}$ condensed aromatic rings, combinations of two or more $C_6$–$C_{18}$ aromatic monocycles connected directly to each other via a single bond, and combinations of two or more $C_6$–$C_{18}$ condensed aromatic rings connected directly to each other via a single bond; n represents the number of repeating units ranging from 2 to 15; and G represents a glycidyl group.

Of these, epoxy resins having a structure represented by the following general formula (2) are particularly preferred:

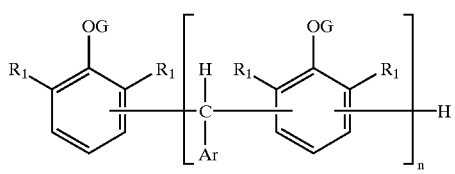

(2)

wherein $R_1$ represents a hydrogen atom, a $C_1$–$C_6$ alkyl group, a $C_5$–$C_6$ cycloalkyl group, a $C_1$–$C_6$ alkoxyl group, a $C_5$–$C_6$ cycloalkoxyl group, a phenyl group, a phenoxy group or a glycidyloxyphenyl group; Ar represents a hydrocarbon group having a member selected from the group consisting of $C_6$–$C_{18}$ condensed aromatic rings, combinations of two or more $C_6$–$C_{18}$ aromatic monocycles connected directly to each other via a single bond, and combinations of two or more $C_6$–$C_{18}$ condensed aromatic rings connected directly to each other via a single bond; n represents the number of repeating units ranging from 2 to 15; and G represents a glycidyl group.

Preferred examples of the epoxy resin having a structure represented by the general formula (2) include those represented by the following formulae (6E) to (20E). (In the following formulae, G represents a glycidyl group which may be substituted by methyl group.)

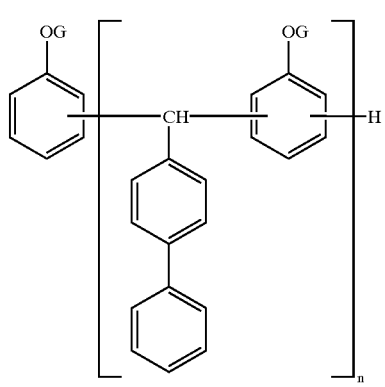

(6E)

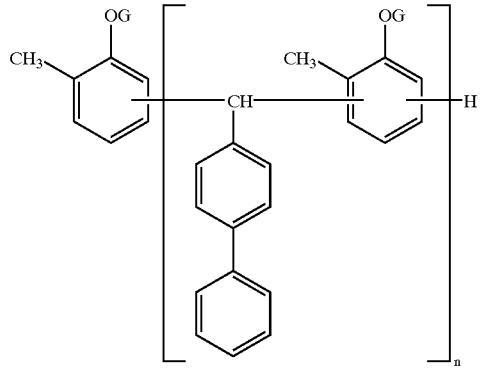

(7E)

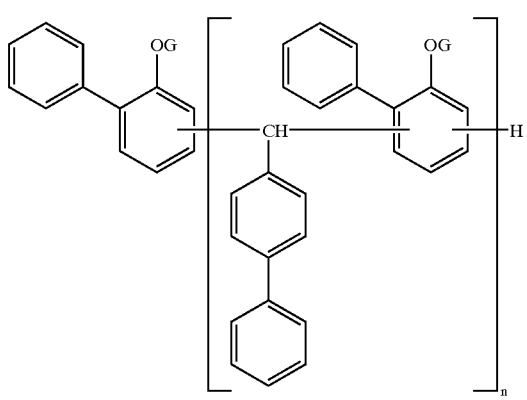

(8E)

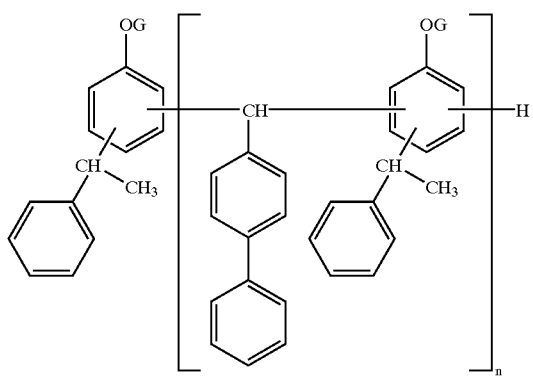

(9E)

(10E)

(11E)
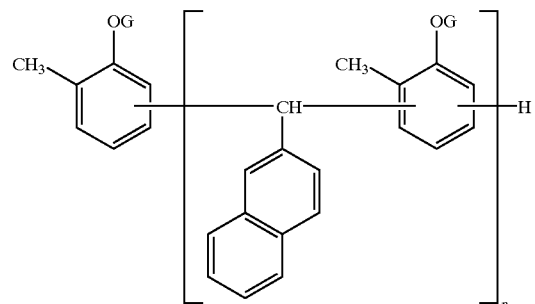
(12E)
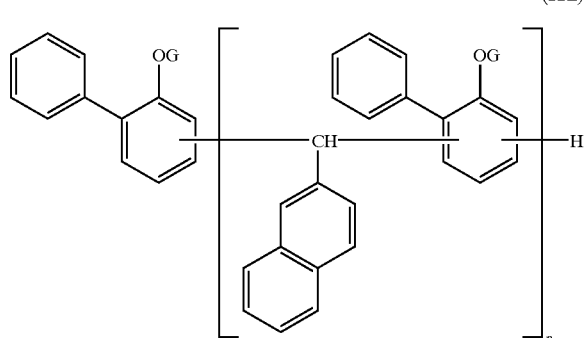
(13E)
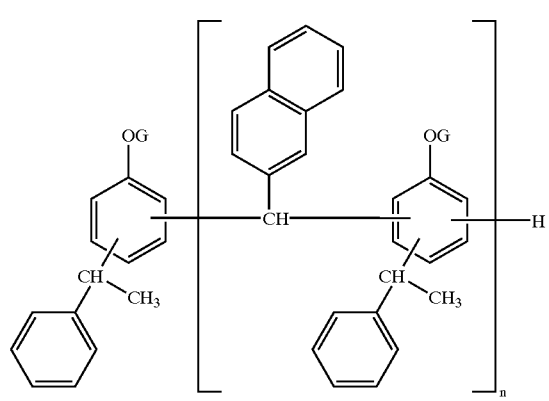
(14E)
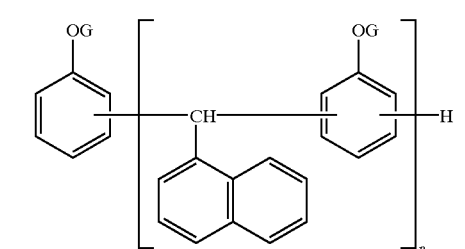
(15E)
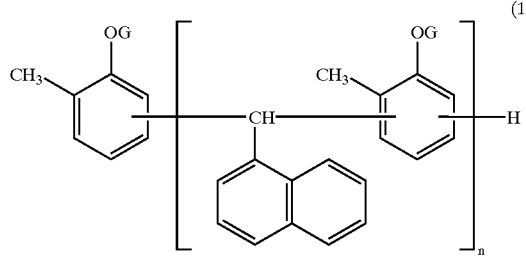
(16E)
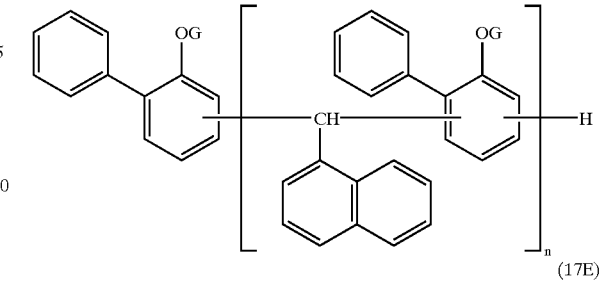
(17E)
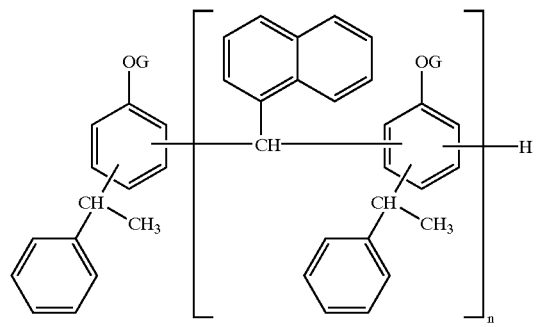
(18E)
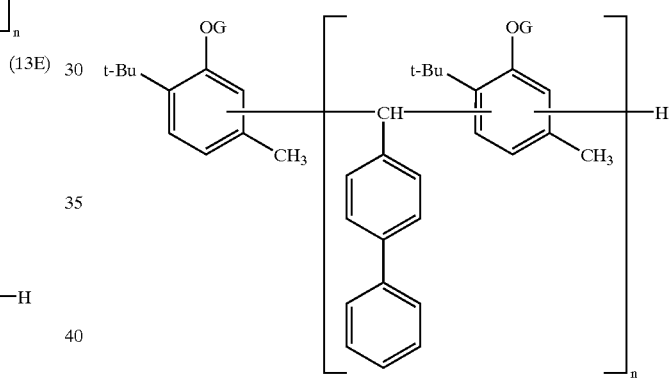
(19E)
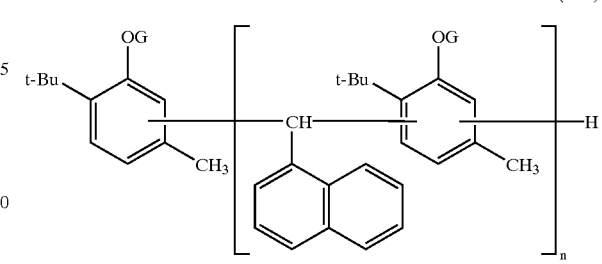
(20E)
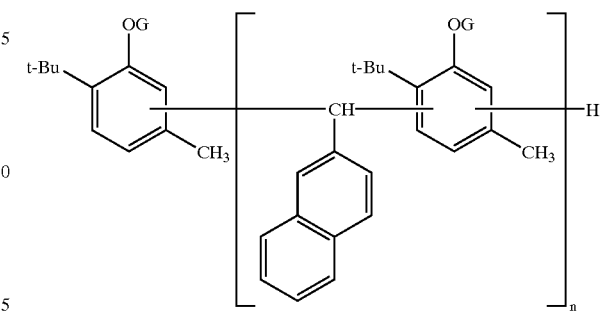

The process for the preparation of these epoxy resins is not specifically limited. In practice, however, such an epoxy resin can be obtained, e.g., by the reaction of an aromatic polyol compound comprising a methylene bond substituted by at least an aromatic ring and a benzene ring substituted by at least a glycidyloxy group, the aromatic ring being at least one selected from the group consisting of (a) condensed aromatic rings and (b) combinations of aromatic rings in which two or more aromatic monocycles or condensed aromatic rings are connected directly to each other via a single bond, with epihalohydrin. The preparation process of the epoxy resin is described below.

The foregoing aromatic polyol compound is not specifically limited in its structure so far as it is a phenol compound having groups connected to each other with a knot group represented by the following structural formula (3):

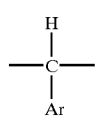

(3)

wherein Ar represents at least one structure selected from the group consisting of: condensed aromatic rings; and combinations of aromatic rings in which two or more aromatic monocycles or condensed aromatic rings are connected directly to each other.

Examples of the foregoing aromatic polyol compound include aromatic polyol compounds represented by the following general formula (4):

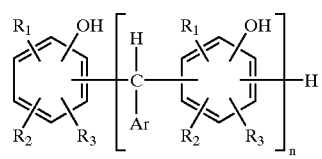

(4)

wherein $R_1$ to $R_3$ may be the same or different and each represent a hydrogen atom, a $C_1$–$C_6$ alkyl group, a $C_5$–$C_6$ cycloalkyl group, a $C_1$–$C_6$ alkoxyl group, a $C_5$–$C_6$ cycloalkoxyl group, a phenyl group, a phenoxy group or a hydroxyphenyl group; Ar represents a hydrocarbon group having a member selected from the group consisting of $C_6$–$C_{18}$ condensed aromatic rings, and combinations of aromatic rings in which two or more $C_6$–$C_{18}$ aromatic monocycles or condensed aromatic rings are connected directly to each other via a single bond; and n represents the number of repeating units ranging from 2 to 15.

More specifically, aromatic polyol compounds represented by the following general formula (5) are preferred:

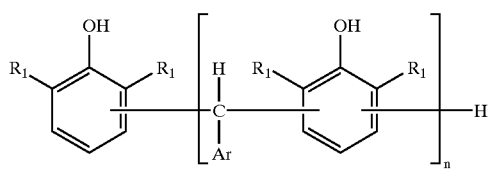

(5)

wherein $R_1$ represents a hydrogen atom, a $C_1$–$C_6$ alkyl group, $C_5$–$C_6$ cycloalkyl group, a $C_1$–$C_6$ alkoxyl group, a $C_5$–$C_6$ cycloalkoxyl group, a phenyl group, a phenoxy group or a hydroxyphenyl group; Ar represents a hydrocarbon group having a member selected from--the group consisting of $C_6$–$C_{18}$ condensed aromatic rings, combinations of aromatic groups in which two or more $C_6$–$C_{18}$ aromatic monocycles or condensed aromatic rings are connected directly to each other via a single bond; and n represents the number of repeating units ranging from 2 to 15.

In the general formula (5), the hydrocarbon group (Ar) having a $C_6$–$C_{18}$ aromatic group is at least one selected from the group consisting of (a) condensed aromatic rings and (b) combinations of aromatic rings in which two or more aromatic monocycles or condensed aromatic rings are connected directly to each other via a single bond, which is the same as defined above.

Next, the foregoing benzene ring substituted by at least a hydroxyl group is further described hereinafter. The foregoing benzene ring is not specifically limited so far as it has a benzene ring substituted by at least a hydroxyl group. Examples of such a substituted benzene ring employable herein include phenol, $C_1$–$C_{10}$ alkyl-substituted phenols (including those isomeric in substitution site) such as cresol, dimethylpheol (xylenol), trimethylphenol, tertiary butylphenol, secondary butylphenol and methyl tertiary butylphenol, $C_5$–$C_6$ cycloalkyl-substituted phenols such as cyclohexylphenol, and residue of phenol compound such as phenylphenol. Two or more of these compounds may be used in combination. Particularly preferred among these compounds are phenol, cresol, xylenol and phenylphenol residue because they can provide an excellent flame retardance.

These aromatic polyol compounds are derived, e.g., from compounds containing an aromatic skeleton-containing aldehyde and the foregoing compound having a benzene ring substituted by at least a hydroxyl group. These compounds containing an aromatic aldehyde group are not specifically limited. Examples of these compounds include biphenyl compounds such as 4-biphenylaldehyde and naphthylaldehydes.

Preferred examples of these compounds include aromatic polyol compounds having the following structural formulae (6) to (20). (The suffix n in the general formulae (6) to (20) indicates the number of repeating units of not smaller than 2.)

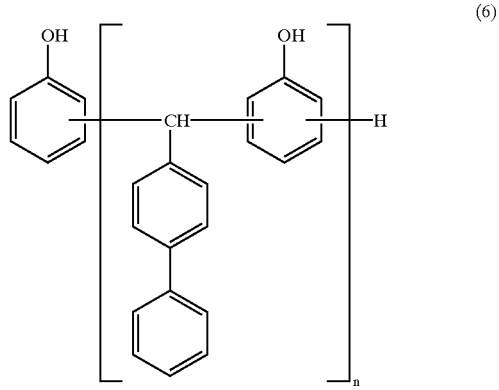

(6)

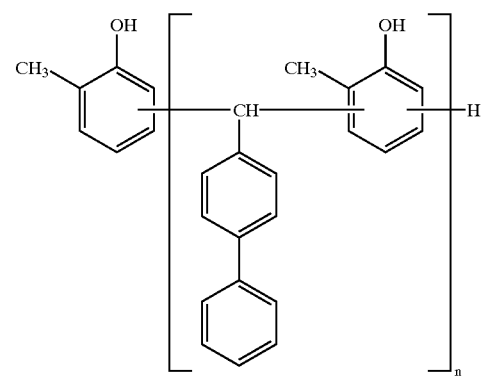
(7)
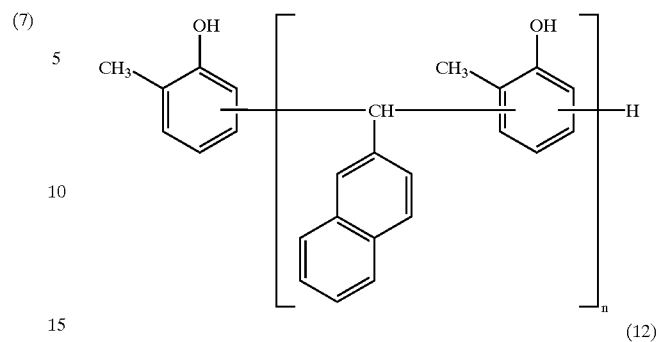
(11)
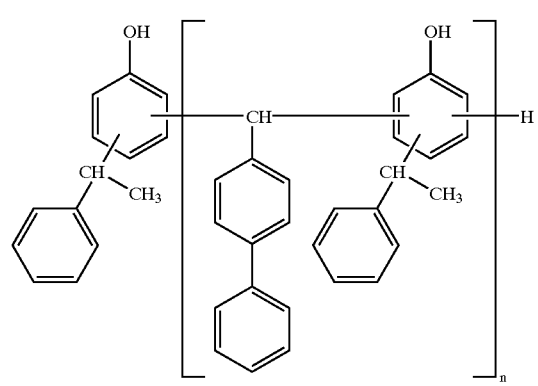
(8)
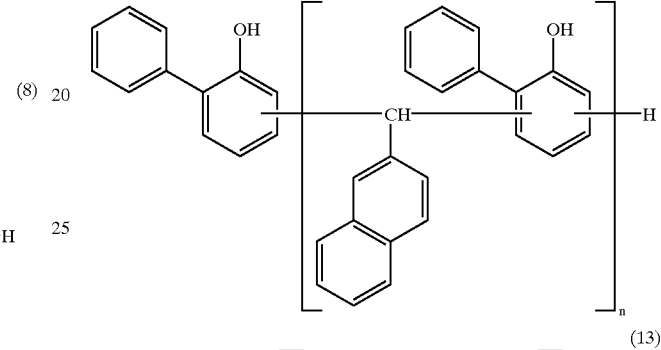
(12)
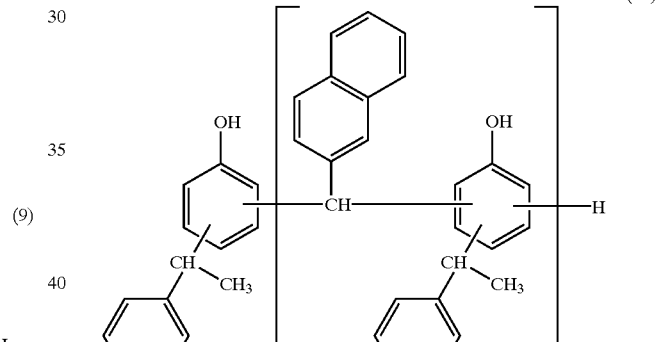
(13)
(9)
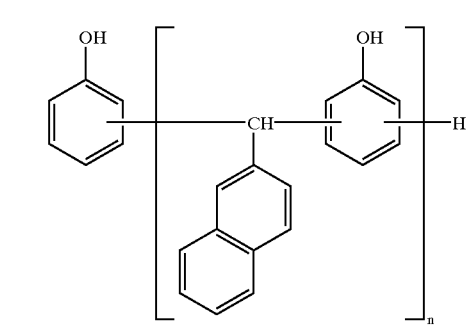
(10)
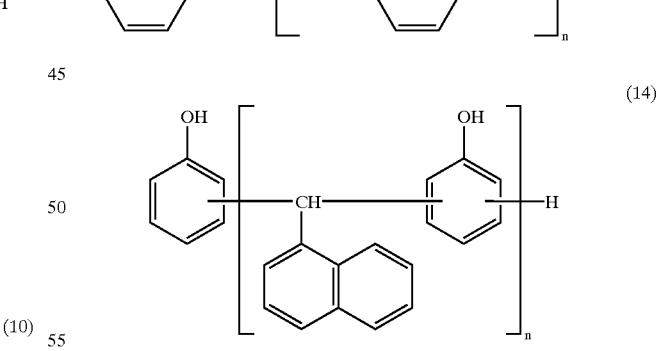
(14)
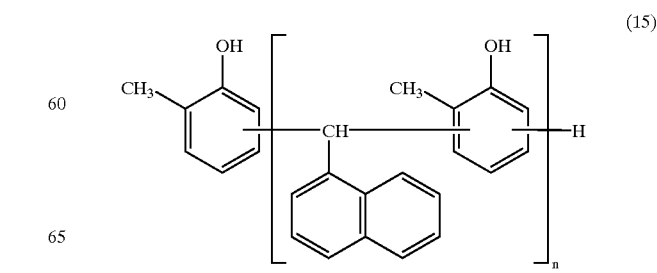
(15)

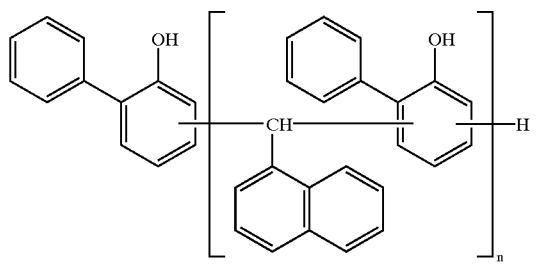

(16)

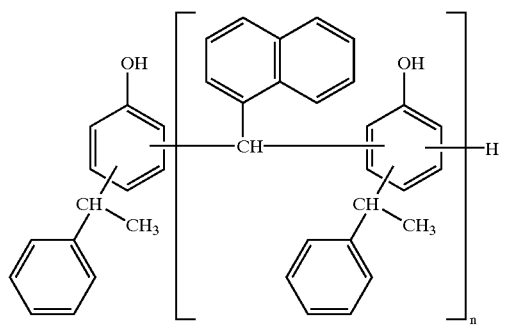

(17)

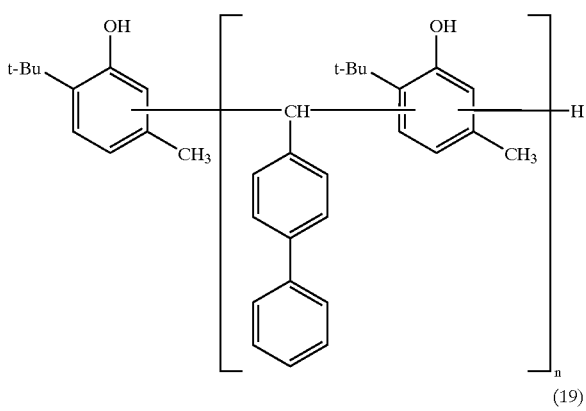

(18)

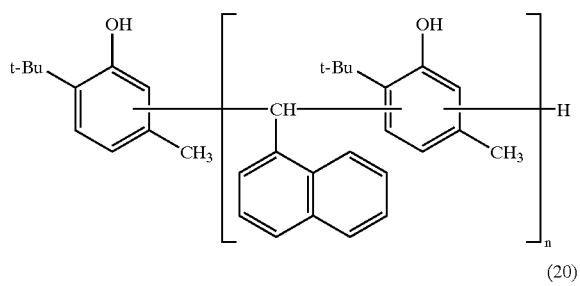

(19)

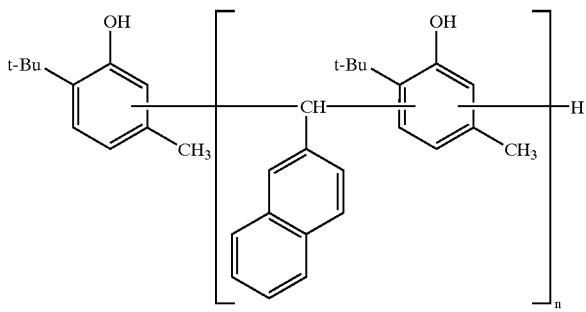

(20)

These aromatic polyol compounds preferably have n of from 2 to 5 to have an excellent heat resistance. These aromatic polyol compounds also preferably have ICI viscosity of from 0.1 dPa·s to 5 dPa·s at 150° C., more preferably not greater than 3 dPa·s to have an excellent humidity resistance and flame retardance.

A process for the preparation of the aromatic polyol compound is described hereinafter. The aromatic polyol compound can be obtained, e.g., by allowing a phenol and an aromatic aldehyde to undergo a condensation reaction.

For the condensation reaction, a phenol (PH) and an aromatic aldehyde (AL) are charged at a molar ratio (PH)/(AL) of from 2/1 to 30/1. The condensation reaction is effected in the presence of an acid catalyst. If necessary, an organic solvent may be used. The acid catalyst to be used herein is not specifically limited so far as it is commonly used for the condensation reaction of phenol with aldehyde. Examples of such an acid catalyst include hydrochloric acid, sulfuric acid, sulfuric anhydride, p-toluenesulfonic acid, methanesulfonic acid, trifluoromethanesulfonic acid, oxalic acid, formic acid, phosphoric acid, trichloroacetic acid, and trifluoroacetic acid. The amount of the catalyst to be added is from 0.01 to 5 parts by weight per 100 parts by weight of the phenol and aldehyde.

Examples of the organic solvent employable herein include aromatic organic solvents such as benzene, toluene and xylene, ketone-based organic solvents such as acetone, methyl ethyl ketone, methyl isobutyl ketone and cyclohexanone, and alcohol-based organic solvents such as methanol, ethanol, isopropyl alcohol and normal butanol. These organic solvents may be properly selected taking into account the properties such as solubility of the raw materials used or products, reaction conditions, economy, etc. The amount of the organic solvent to be used is from 10 to 500 parts by weight per 100 parts by weight of the phenol and aldehyde.

Referring to the reaction conditions, the reaction materials may be heated to a temperature of from room temperature to 200° C., preferably from 50° C. to 150° C., with stirring for 0.5 to 30 hours. In the case where the resulting reaction product is easily crystallized, the reaction solution may be cooled for crystallization to isolate the desired material. The resulting desired material may be optionally subjected to treatment such as concentration, neutralization and recrystallization. In the case where the resulting reaction product can be difficultly crystallized, the concentrated material may be subjected to purification by recrystallization, reprecipitation or the like to raise the purity of the desired material. As the phenols there may be used two or more phenols.

The process for the preparation of an epoxy resin involving the reaction of an aromatic polyol compound with an epihalohydrin will be described hereinafter. In the accordance with this preparation process, the foregoing aromatic polyol compound represented by the general formula (4) and an epihalohydrin such as epichlorohydrin, epibromohydrin or methylepichlorohydrin are reacted at a temperature of from 20° C. to 120° C. in the presence of a hydroxide of alkaline metal such as sodium hydroxide and potassium hydroxide or with such a hydroxide of alkaline metal being added for 1 to 10 hours to obtain the foregoing epoxy resin.

The amount of the epihalohydrin to be added is normally from 0.3 to 20 equivalents per 1 equivalent of hydroxyl group in the aromatic polyol. When the amount of the epihalohydrin to be added falls below 2.5 equivalents, the epoxy group and the unreacted hydroxyl group can easily react with each other to obtain a high molecular compound containing a group produced by the addition reaction of the epoxy group with the unreacted hydroxyl group (—CH₂CR(OH)CH₂— in which R represents a hydrogen atom or organic carbon group). On the contrary, when the amount of the epihalohydrin to be added exceeds 2.5 equivalents, the resulting reaction product has a high content of theoretical structure. Thus, the amount of the epihalohydrin to be added may be properly adjusted depending on the desired properties.

In the reaction for obtaining the epoxy resin to be used herein, the hydroxide of alkaline metal may be used in the form of aqueous solution. In this case, water and epihalohydrin may be continuously distilled off under reduced or normal pressure while the aqueous solution of hydroxide of alkaline metal is being continuously added to the reaction system. The reaction solution is further subjected to separation to remove water. The epihalohydrin may be continuously returned to the reaction system.

An alternative reaction process comprises adding a quaternary ammonium salt such as tetramethyl ammonium chloride, tetramethyl ammonium bromide and trimethylbenzyl ammonium chloride as a catalyst to a dissolved mixture of an aromatic polyol compound represented by the general formula (4) and an epihalohydrin, reacting these components at a temperature of from 50° C. to 150° C. for 1 to 5 hours, adding a hydroxide of alkaline metal in the form of solid or aqueous solution to the resulting halohydrinetherification product of aromatic polyol compound, and then reacting these components at a temperature of from 20° C. to 120° C. for 1 to 10 hours to remove hydrogen halide (ring opening).

In order to allow the reaction to proceed smoothly, the reaction is preferably conducted with the addition of an alcohol such as methanol, ethanol, isopropyl alcohol and butanol, a ketone such as acetone and methyl ethyl ketone, an ether such as dioxane, an aprotic polar solvent such as dimethylsulfone and dimethyl sulfoxide or the like. The amount of the solvent to be used is normally from 5 to 50 parts by weight, preferably from 10 to 30 parts by weight per 100 parts by weight of the epihalohydrin. The amount of the solvent, if it is an aprotic polar solvent, to be used is normally from 5 to 100 parts by weight, preferably from 10 to 60 parts by weight per 100 parts by weight of the epihalohydrin.

The product of epoxylation reaction is optionally washed with water, and then heated to a temperature of 110° C. to 250° C. under a pressure of not higher than 10 mmHg to remove the epihalohydrin or other added solvents. In order to obtain an epoxy resin containing little hydrolyzable halogen, a crude epoxy resin obtained after the collection of epihalohydrin, etc. may be dissolved in a solvent such as toluene and methyl isobutyl ketone. The resulting solution is then reacted with an aqueous solution of hydroxide of alkaline metal such as sodium hydroxide and potassium hydroxide to assure ring opening. In this case, the amount of the hydroxide of alkaline metal to be used is normally from 0.5 to 10 mols, preferably from 1.2 to 5.0 mols per mol of the hydrolyzable chlorine remaining in the crude epoxy resin. The reaction temperature is normally from 50° C. to 120° C. The reaction time is preferably from 0.5 to 3 hours. For the purpose of enhancing the reaction speed, a phase transfer catalyst such as quaternary ammonium salt and crown ether may be present in the reaction system. The amount of the phase transfer catalyst to be used is preferably from 0.1 to 3.0 parts by weight per 100 parts by weight of the crude epoxy resin.

After the termination of reaction, the resulting salt is removed by filtration, rinsing or the like. The solvent such as toluene and methyl isobutyl ketone is then distilled off under reduced pressure to obtain the epoxy resin of the invention.

It is preferred that the epoxy resin thus obtained exhibits an ICI viscosity at 150° C. of from 0.1 to 5.0 dPa·s, and n is not smaller than 2. Furthermore, n is preferably not greater than 15 for attaining excellent humidity resistance and flame retardance. Particularly, n is preferably from 2 to 10.

The epoxy resin composition of the invention may comprise the foregoing epoxy resin singly or further comprise other epoxy resins in combination. The proportion of the foregoing epoxy resin according to the invention, if used in combination with other epoxy resins, in the total epoxy resin is preferably not smaller than 30% by weight, particularly not smaller than 40% by weight. As the other epoxy resins to be used in combination with the foregoing epoxy resin there may be used various epoxy resins. Examples thereof include bisphenol A type epoxy resin, bisphenol F type epoxy resin, biphenyl type epoxy resin, tetramethyl biphenyl type epoxy resin, phenol novolac type epoxy resin, cresol novolac type epoxy resin, triphenylmethane type epoxy resin, tetraphenylethane type epoxy resin, dicyclopentadiene-phenol addition reaction type epoxy resin, phenolaralkyl type epoxy resin, naphthol-novolac type epoxy resin, naphtholaralkyl type epoxy resin, naphtholphenol co-condensed novolac type epoxy resin, naphtholcresol co-condensed novolac type epoxy resin, aromatic hydrocarbon formaldehyde resin-modified phenol resin type epoxy resin, biphenyl-modified novolac type epoxy resin, tetrabormobisphenol A type epoxy resin, and brominated phenol novolac type epoxy resin. These epoxy resins may be used singly or in admixture.

If necessary, epoxy resins obtained by the reaction of an aromatic bisphenol with an epihalohydrin, which are epoxy resins represented by the above-shown structural formulae (5e) to (19e) wherein n is 1, or epoxy resins obtained by the reaction of an aromatic bisphenol represented by structural general formulae (29) to (34) shown below with an epihalohydrin may be used in combination.

The epoxy resin composition of the invention comprises the foregoing epoxy resin and a curing agent as essential components. As the curing agent there may be used any curing agent such as amine-based compound, acid anhydride, amide-based compound and phenol-based compound. Examples of the curing agent employable herein include diaminodiphenylmethane, diethylenetriamine, triethylenetetramine, diaminodiphenyl sulfone, isophoronediamine, dicyandiimide, polyamide resin synthesized from a dimer of linolenic acid and ethylenedimaine, phthalic anhydride, trimellitic anhydride, maleic anhydride, tetrahydrophthalic anhydride, methylhexahydrophelic anhydride, polyvalent phenol compound such as phenol novolac resin, cresol novolac resin, aromatic hydrocarbon formaldehyde resin-modified phenol resin, dicyclopentadiene phenol adduct type resin, phenolaralkyl resin, naphtholaralkyl resin, trimethylolmethane resin, tetraphenylolethane resin, naphthol novolac resin, naphthol-phenol co-condensed novolac resin, naphthol-cresol co-condensed novolac resin, biphenyl-modified novolac resin and aminotriazine-modified phenol resin, modification product thereof, imidazole, BF₃-amine complex, and guanidine derivative. These curing agents may be used singly or in combination of two or more thereof. Preferred among these curing agents are aromatic polyol resin, phenol-novolacresin, cresol novolac resin, aromatic hydrocarbon formaldehyde resin-modified phenolic resin, phenolaralkyl resin, naphtholaralkyl resin, naphthol novolac resin, naphtholphenol co-condensed novolac resin, naphthol-cresol co-condensed novolac resin, biphenyl-modified phenolic resin, and aminotriazine-modified phenol resin because they are excellent in flame retardance. Furthermore, polyvalent aromatic hydroxyl group-containing compounds having hydroxyl group-containing aromatic nuclei connected to each other via a hydroxyl group-free aromatic skeleton-containing group as a knot group are preferably used. Specifically, compounds represented by the following structural formulae (29) to (34) may be used.

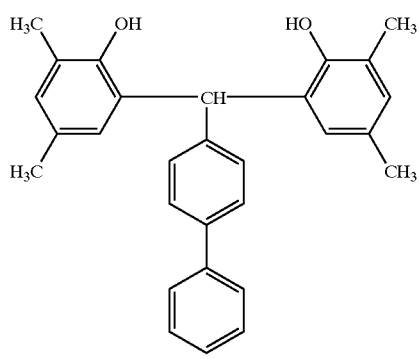

(29)

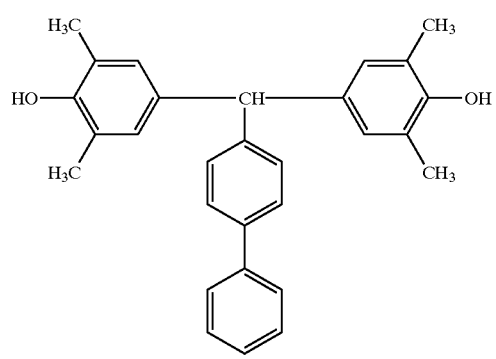

(30)

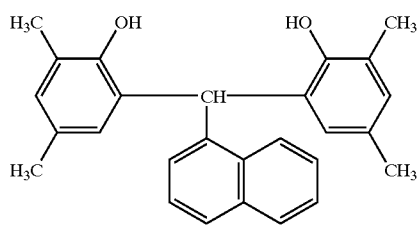

(31)

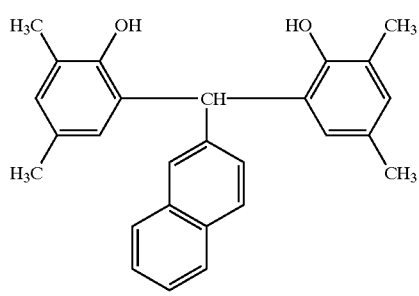

(32)

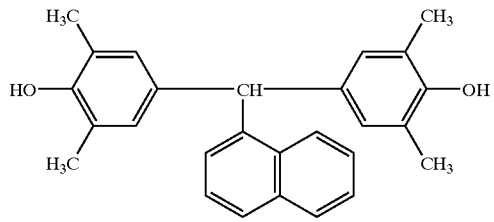

(33)

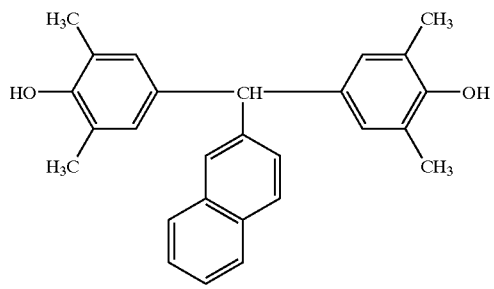

(34)

In the case where the reaction is effected using the foregoing aromatic polyol compound as a curing agent, the proportion of the aromatic polyol compound in the total curing agent is preferably not smaller than 30% by weight, particularly not smaller than 40% by weight.

The amount of the curing agent to be incorporated in the epoxy resin composition of the invention is preferably such that the amount of the active hydroxyl group in the curing agent is from 0.7 to 1.5 equivalents per 1 equivalent of the epoxy group in the epoxy resin because the curing reaction can be completed to provide the cured product with good physical properties.

A curing accelerator may be properly used. As such a curing accelerator there may be used any curing accelerator. Examples of such a curing accelerator employable herein include phosphor-based compound, tertiary amine, imidazole, organic acid metal salt, Lewis acid, and amine complex salt. These curing accelerators may be used not only singly or in combination of two or more thereof. If used for semiconductor-sealing material, the curing accelerator may be a phosphor-based compound such as triphenyl phosphine or amine-based compound such as 1,8-bicyclo-[5,4,0]-undecene (DBU) because of their excellency in curability, heat resistance, electrical properties, reliability in humidity resistance, etc.

The epoxy resin composition of the invention may comprise an inorganic filler, a flame retardant or a flame retardance-imparting agent incorporated therein.

As the inorganic filler to be used herein there may be used fused silica, crystalline silica, alumina, silicon nitride, aluminum nitride or the like. In order to increase the mixing ratio of the inorganic filler in particular, it is usual to use fused silica. The fused silica may be used in either crushed form or spherical form. In order to enhance the mixing ratio of fused silica and prevent the increase of the melt viscosity of the molding material, it is preferred that spherical fused silica be mainly used. In order to enhance the mixing ratio of spherical silica, the inorganic filler is preferably prepared such that the distribution of particle size of spherical silica is widened more. The percent packing of fused silica is preferably as high as possible taking into account the flame retardance of the epoxy resin composition. It is particularly preferred that the percent packing of fused silica be from 65% to 95% by weight based on the total weight of the epoxy resin composition.

As the flame retardant or flame retardance-imparting agent to be used herein there may be used any flame retardant, including halogen-based flame retardant, without any restriction. The epoxy resin composition of the invention preferably comprises a phosphorus atom-containing compound, nitrogen atom-containing compound, organic silicon compound or inorganic flame retardant compound incorporated therein because these flame retardants exhibit flame retardance even if the epoxy resin composition is free of halogen.

Specific examples of the phosphorus atom-containing compound include red phosphorus, ammonium polyphosphate, and organic phosphorus compound such as phosphoric acid ester compound, phosphinic acid and phosphazene compound. The term "red phosphazene" as used herein is meant to indicate red which may be subjected to surface treatment. Examples of such a surface-treated red phosphorus employable herein include red phosphorus coated with a film of metal hydroxide such as magnesium hydroxide, zinc hydroxide and titanium hydroxide, red phosphorus coated with a film made of a thermosetting resin such as magnesium hydroxide, zinc hydroxide and titanium hydroxide, and red phosphorus coated with a film of metal hydroxide selected from magnesium hydroxide, zinc hydroxide and titanium hydroxide and then with a film of thermosetting resin. The foregoing phosphorus compound may have a functional group such as phosphoric acid amide, amino group, phenolic hydroxyl group and epoxy group. The amount of the phosphorus compound to be used is preferably 0.1% by weight because of its remarkable effect of improving flame retardance, not greater than 5.0% by weight, more preferably from 0.2 to 3.0% by weight based on the other mixing components except the foregoing filler as calculated in term of phosphorus atom because it provides good moldability and humidity resistance that prevents bleeding of phosphorus atom-containing compound.

Specific examples of the nitrogen atom-containing compound employable herein include melamine, benzoguanamine, acetoguanamine, compound derived from the foregoing triazine compound, melamine sulfate, aminotriazine sulfate, melamine cyanurate, and cyanuric acid. These nitrogen atom-containing compounds may have a functional group such as phenolic hydroxyl group. The amount of the nitrogen atom-containing compound to be added is preferably not smaller than 0.1% by weight because it exerts a remarkable effect of improving flame retardance, not greater than 20% by weight, more preferably from 1 to 10% by weight based on the other mixing components except the foregoing filler as calculated in term of nitrogen atom because it provides a good humidity resistance.

Specific examples of the organic silicon compound employable herein include compounds having an alkyl group such as phenyl group and methyl group. These organic silicon compounds may have a functional group such as phenolic hydroxyl group, amino group and epoxy group. The amount of the organic silicon compound to be added is preferably not smaller than 0.1% by weight because it exerts a remarkable effect of improving flame retardance, not greater than 20% by weight, more preferably from 1 to 10% by weight based on the other mixing components except the foregoing filler as calculated in term of nitrogen atom because it provides a good-adhesion.

Specific examples of the inorganic flame retardant compound employable herein include hydrous metal compounds such as aluminum hydroxide, magnesium hydroxide, dolomite, hydrotalcite, calcium hydroxide, barium hydroxide, basic magnesium carbonate, zirconium hydroxide and tin oxide, metal oxides such as silica, aluminum oxide, iron oxide, titanium oxide, manganese oxide, magnesium oxide, zirconium oxide, zinc oxide, molybdenum oxide, cobalt oxide, bismuth oxide, chromium oxide, tin oxide, antimony oxide, nickel oxide, copper oxide and tungsten oxide, material obtained by coating a metal such as aluminum, iron, ferrocene, titanium, manganese, zinc and molybdenum with a resin or inorganic material, cobalt, cobalt metal complexes such as cobalt-naphthenic acid complex and cobalt-ethylenediamine complex, boric acid metal salts such as boric acid, borax and zinc borate, zinc carbonate, magnesium carbonate, calcium carbonate, and barium carbonate. The foregoing inorganic flame retardant compound may be coated with a resin or inorganic material on the surface thereof. The surface coating makes it possible to enhance the reliability in adhesion or the like in use as sealing material. The amount of the inorganic flame retardant compound to be added is preferably not smaller than 0.1% by weight because it exerts a remarkable effect of improving flame retardance, not greater than 10% by weight, more preferably from 0.1 to 5% by weight based on the other mixing components except the foregoing filler because it provides a good moldability.

The epoxy resin composition of the invention may comprise various compounding agents such as silane coupling agent, release agent and pigment incorporated therein.

The epoxy resin molding material of the invention may be obtained by uniformly mixing these components. The epoxy resin composition of the invention comprising an epoxy resin and a curing agent of the invention and optionally a curing accelerator can be easily cured by the same method as method which has heretofore been known to obtain a cured product.

In order to prepare a semiconductor-sealing material, the epoxy resin and curing agent and compounding agents such as inorganic filler may be thoroughly mixed optionally by means of an extruder, kneader, roll or the like until a uniform mixture is obtained to provide a melt-mixed epoxy resin composition. During this procedure, as a filler there may be normally used silica. The percent packing of silica is from 30% by weight to 95% by weight. In order to enhance the flame retardance, humidity resistance and solder crack resistance and lower the linear expansion coefficient of the semiconductor-sealing material, the percent packing of silica is preferably not greater than 65% by weight. In order to remarkably enhance these effects, the percent packing of silica is particularly not greater than 80% by weight.

In order to prepare a circuit board material, the epoxy resin composition of the invention may be dissolved in a solvent such as toluene, xylene, acetone, methyl ethyl ketone and methyl isobutyl ketone to form a varnish-like composition. The amount of the solvent to be used is normally from 10% to 70% by weight, preferably from 15% to 65% by weight, particularly from 20% to 50% by weight based on the total weight of the mixture of the epoxy resin composition of the invention and the solvent.

The cured product of the invention can be obtained by heat-curing the epoxy resin composition of the invention. The cured product of the invention may be in the form of molded product, laminated product, casted product, adhesive or film. For example, the melt-mixed composition can be casted or may be heated to a temperature of from 80° C. to 200° C. using a transfer molding machine, injection molding machine or the like for 2 to 10 hours to obtain a cured product. The semiconductor packaging corresponds to this procedure. The varnish-like composition can be allowed to penetrate in a base material such as glass fiber, carbon fiber, polyester fiber, polyamide fiber, alumina fiber and paper which is then heated and dried to obtain a prepreg. The prepreg thus obtained is then heat-pressed to obtain a cured product. The laminating material for circuit board corresponds to this material. Examples of the foregoing circuit board material employable herein include printed wiring circuit board, printed circuit board, flexible printed wiring circuit board, and build-up wiring circuit board.

The foregoing epoxy resin composition can be used as a flame retardant epoxy resin substantially free of halogen compound. The term "flame retardant epoxy resin substantially free of halogen compound" as used herein is meant to indicate an epoxy resin composition which exhibits flame retardance even if it is free of halogen compound which is to be added for the purpose of flame retardation. Accordingly, impurity halogen contained in the epoxy resin derived from the epihalohydrin in an amount as slight as not greater than 5,000 ppm is not included in this meaning and thus does not matter if any.

EXAMPLES

The invention will be described in greater detail with reference to the following-examples and comparative examples, but the invention should not be construed as being limited thereto. All the "parts" are given by weight unless otherwise indicated.

Preparation Example 1

In a flask equipped with a thermometer, a condenser and an agitator which was being purged with nitrogen gas were charged 470.0 g (5.0 mols) of phenol and 91.0 g (0.5 mols) of 4-biphenylaldehyde to make a solution. Subsequently, to the solution was added 2.7 g of paratoluenesulfonic acid. The mixture was heated to a temperature of 120° C. where it was then held with stirring for 5 hours. Thereafter, the mixture was dissolved in 1,000 g of methyl isobutyl ketone. The solution was then washed with 100 g of water three times. Thereafter, the unreacted phenol was recovered under reduced pressure to obtain 150 g of the objective aromatic polyol compound (A). The compound thus obtained was then identified as an aromatic polyol compound represented by the structural formula (6) by mass spectrum (FD-MS, m/e=610, 869).

Preparation Example 2

180 g (hydroxyl group: 1.0 equivalent) of the aromatic polyol compound (A) thus obtained in Preparation Example 1, 370 g (4.0 mols) of epichlorohydrin, 42 g of n-butanol and 2.3 g of tetraethylbenzyl ammonium chloride were charged and dissolved. The mixture was heated to a temperature of 65° C. Thereafter, the pressure of the reaction system was reduced to a value at which azeotropy occurs. To the mixture was then added dropwise 82 g (1.0 mol) of a 49% aqueous solution of sodium hydroxide in 5 hours. Subsequently, the mixture was stirred under the same conditions for 0.5 hours. During this procedure, the distillate from azeotropy was separated by a Dean Stark trap to remove the aqueous phase. The oil phase was then returned to the reaction system for reaction. Thereafter, the unreacted epichlorohydrin was distilled off under reduced pressure. To the resulting crude epoxy resin were then added 490 g of methyl isobutyl ketone and 49 g of n-butanol. To the solution thus obtained were then added 15 parts by weight of a 10% aqueous solution of sodium hydroxide. The mixture was then reacted at a temperature of 80° C. for 2 hours. The reaction product was then washed with 100 g of water three times until the wash water became neutral (pH 7.0). Subsequently, azeotropy was caused to dehydrate the reaction system. The reaction solution was subjected to precision filtration, and then subjected to distillation under reduced pressure to remove the solvent. As a result, 189 g of an epoxy resin (A) represented by the structural formula (6E) was obtained. The epoxy equivalent of the epoxy resin thus obtained was 250 g/eq. It was then confirmed by signals of m/e 464, 778 and 1093 of FD-MS that this epoxy resin had been produced.

Preparation Example 3

In a flask equipped with a thermometer, a condenser and an agitator which was being purged with nitrogen gas were charged 176 g (hydroxyl group: 1.0 equivalent) of a bisphenol compound represented by structural formula (40) shown below, 370 g (4.0 mols) of epichlorohydrin, 42 g of n-butanol and 2.3 g of tetraethylbenzylammonium chloride to make a solution. The solution was heated to a temperature of 65° C. The pressure of the reaction system was reduced to a value at which azeotropy occurs. To the reaction mixture was then added dropwise 83 g (1.0 mol) of a 49% aqueous solution of sodium hydroxide in 5 hours. Subsequently, the reaction mixture was stirred under the same conditions for 0.5 hours. During this procedure, the distillate from azeotropy was separated by a Dean Stark trap to remove the aqueous phase. The oil phase was then returned to the reaction system for reaction. Thereafter, the unreacted epichlorohydrin was distilled off under reduced pressure. To the resulting crude epoxy resin were then added 490 g of methyl isobutyl ketone and 49 g of n-butanol to make a solution. To the solution was then added 15 g of a 10% aqueous solution of sodium hydroxide. The reaction mixture was allowed to undergo reaction at a temperature of 80° C. for 2 hours. The reaction product was then washed with 100 g of water three times until the wash water became neutral (pH 7.0). Subsequently, azeotropy was caused to dehydrate the reaction system. The reaction solution was subjected to precision filtration, and then subjected to distillation under reduced pressure to remove the solvent. As a result, 212 g of an epoxy resin (B) represented by the following structural formula (41) was obtained. The epoxy equivalent of the epoxy resin thus obtained was 247 g/eq. The epoxy resin exhibited a softening point of 56° C.

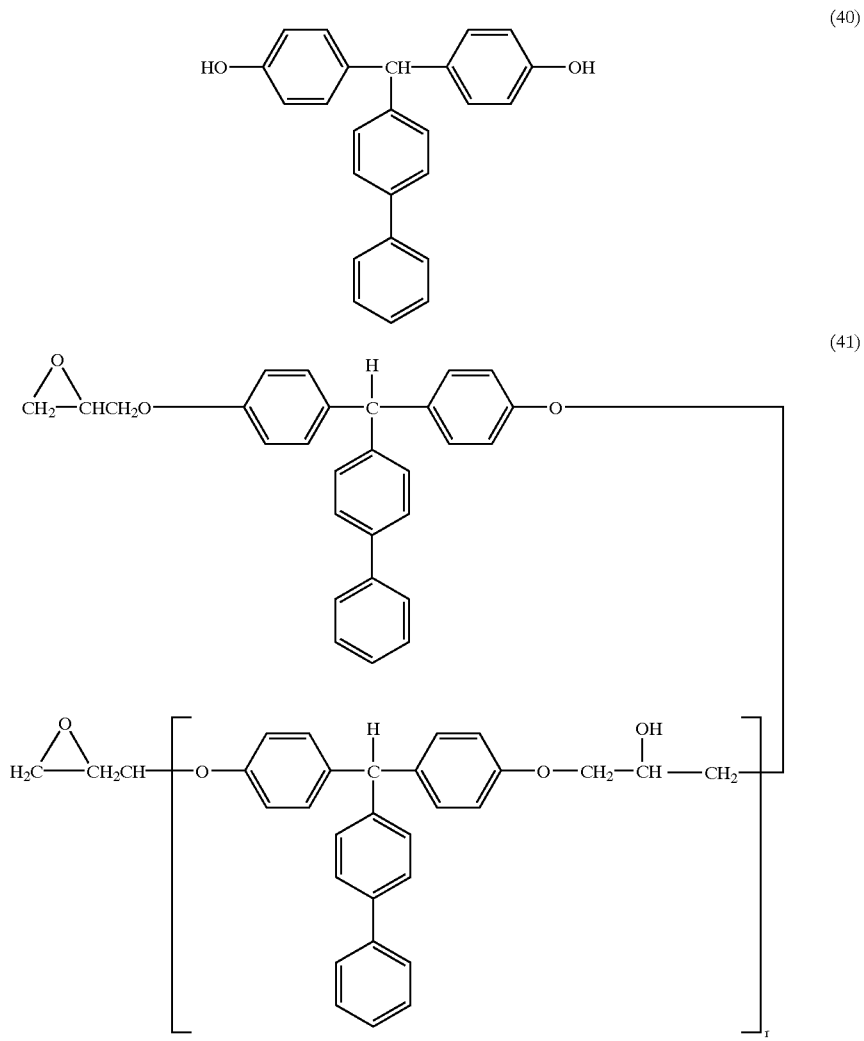

Examples 1 to 2 and Comparative Examples 1 to 6

The epoxy resin (A) obtained in Preparation Example 1, and for comparison, the epoxy resin (B) obtained in Preparation Example 3, a bisphenol A type epoxy resin (EPICLON 1055; produced by DAINIPPON INK & CHEMICALS, INC.; epoxy equivalent: 475 g/eq.) and a cresol-novolac type epoxy resin (EPICLON N-665-EXP-S; produced by DAINIPPON INK & CHEMICALS, INC.; epoxy equivalent: 202 g/eq.) were used and each were blended with a phenol-novolac resin (PHENOLITE TD-2131; produced by DAINIPPON INK & CHEMICALS, INC.; softening point: 80° C.; hydroxyl equivalent: 104 g/eq.) or a phenolaralkyl resin (Mirex XL-225-2L; produced by MITSUI CHEMICAL CORPORATION; softening point: 74° C.; hydroxyl equivalent: 175 g/eq.) as a curing agent, triphenylphosphine (TPP) as a curing accelerator and a fused silica (RD-8, produced by TATSUMORI CO., LTD.) as an inorganic filler, according to the formulation set forth in Table 1. The blend was then melt-kneaded at a temperature of 100° C. using a twin roll for 10 minutes to obtain an objective composition. The composition thus obtained was press-molded at a temperature of 180° C. for 10 minutes, and then cured at a temperature of 180° C. for 5 hours. A specimen was prepared from the cured product thus obtained. The specimen was then subjected to flame retardance test and heat resistance (Tg) test.

These tests were conducted as follows.

Flame Retardance

A specimen having a thickness of ¹/₁₆ inch was used. The flame retardance test was conducted according to UL specification and UL-94V test standard. For evaluation, five specimens were measured and the total combustion time (sec) thereof was used for comparison.

Tg (Glass Transition Temperature)

For measurement of Tg, DMA process was used. The temperature rising speed was 3° C./min.

TABLE 1

| Table 1 | | Example Nos. | | Comparative Example Nos. | | | | | |
|---|---|---|---|---|---|---|---|---|---|
| | | 1 | 2 | 1 | 2 | 3 | 4 | 5 | 6 |
| Epoxy resin (A) | parts | 118 | 118 | — | — | — | — | — | — |
| Expoxy resin (B) | parts | — | — | 117 | 117 | — | — | — | — |
| Bisphenol A type epoxy resin | parts | — | — | — | — | 147 | 147 | — | — |
| Cresol-novolac type epoxy resin | parts | — | — | — | — | — | — | 107 | 107 |
| Phenolaralkyl resin | parts | 82 | 82 | 83 | 83 | 53 | 53 | 93 | 93 |
| Triphenyl phosphine | parts | 2 | 2 | 2 | 2 | 2 | 2 | 2 | 2 |
| Fused silica | parts | — | 800 | — | 800 | — | 800 | — | 800 |
| Flame retardance time (sec) | | 70 | 16 | 106 | 53 | Combusted | Combusted | Combusted | Combusted |
| Flame retardance test judgment | | V-1 | V-0 | V-1 | V-1 | | | | |
| Tg (glass transition temperature) ° C. | | 150 | 151 | 139 | 140 | 110 | 111 | 160 | 162 |

Preparation Example 4

In a flask equipped with a thermometer, a condenser and an agitator which was being purged with nitrogen gas were charged 282.0 g (3.0 mols) of phenol and 91.0 g (0.5 mols) of 4-biphenylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 150 g of the objective aromatic polyol compound (A).

The compound thus obtained was then confirmed by mass spectrum to have m/e of 610 and 869 corresponding to n of 2 and 3 in t he structural formula (6), respectively.

Preparation Example 5

In a flask equipped with a thermometer, a condenser and an agitator which was being purged with nitrogen gas were charged 610.9 g (5.0 mols) of o-cresol and 91.0 g (0.5 mols) of 4-biphenylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 100 g of an aromatic polyol compound (A) represented by the structural formula (7). The compound thus obtained was then confirmed by mass spectrum to have m/e of 542 and 752 corresponding to n of 2 and 3 in the structural formula (7), respectively.

Preparation Example 6

In a flask equipped with a thermometer, a condenser and an agitator which was being purged with nitrogen gas were charged 510.6 g (3.0 mols) of biphenyl-2-ol and 91.0 g (0.5 mols) of 4-biphenylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 110 g of an aromatic polyol compound represented by the structural formula (8). The compound thus obtained was then confirmed by mass spectrum to have m/e of 542 and 752 corresponding to n of 2 and 3 in the structural formula (8), respectively.

Preparation Example 7

In a flask equipped with a thermometer, a condenser and an agitator which was being purged with nitrogen gas were charged 282.0 g (3.0 mols) of phenol and 312.4 g (2.0 mols) of 2-naphthylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 250 g of an aromatic polyol compound represented by the structural formula (10). The compound thus obtained was then confirmed by mass spectrum to have m/e of 558 and 790 corresponding to n of 2 and 3 in the structural formula (10), respectively.

Preparation Example 8

In a flask equipped with a thermometer, a condenser and an agitator which was being purged with nitrogen gas were charged 324.3 g (3.0 mols) of o-cresol and 312.4 g (2.0 mols) of 2-naphthylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 250 g of an aromatic polyol compound represented by the structural formula (11). The compound thus obtained was then confirmed by mass spectrum to have m/e of 600 and 846 corresponding to n of 2 and 3 in the structural formula (11), respectively.

Preparation Example 9

In a flask equipped with a thermometer, a condenser and an agitator which was being purged with nitrogen gas were charged 850.6 g (5.0 mols) of biphenyl-2-ol and 312.4 g (2.0 mols) of 2-naphthylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 250 g of an aromatic polyol compound represented by the structural formula (12). The compound thus obtained was then confirmed by mass spectrum to have m/e of 786 and 1019 corresponding to n of 2 and 3 in the structural formula (12), respectively.

Preparation Example 10

In a flask equipped with a thermometer, a condenser and an agitator which was being purged with nitrogen gas were charged 881.3 g (5.0 mols) of 4-cyclohexylphenol and 312.4 g (2.0 mols) of 2-naphthylaldehyde to make a solution. Subsequently, to the solution was added 2.7 g of paratoluenesulfonic acid. The reaction mixture was heated to a temperature of 120° C. where it was then held with stirring for 5 hours. Thereafter, the reaction product was dissolved in 1,000 g of methyl isobutyl ketone, and then washed with 100 g of water three times. Thereafter, the unreacted phenol was recovered under reduced pressure to obtain 250 g of the objective aromatic polyol compound represented by structural formula (42) shown below. The compound thus obtained was then confirmed by mass spectrum to have m/e of 791 and 805 corresponding to n of 2 and 3 in the structural formula (42), respectively.

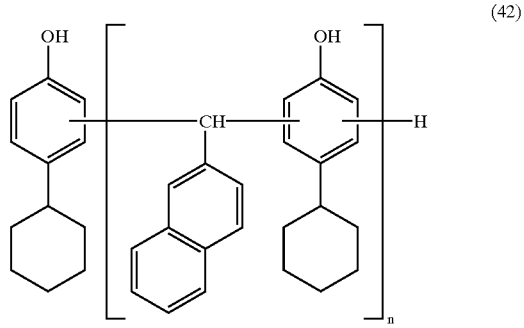

(42)

The epoxy resin composition of the invention exhibits an excellent flame retardance and provides its cured product with an excellent flame retardance even if it is free of halogen compound. The epoxy resin composition of the invention is extremely useful for semiconductor-sealing material or electronic material such as printed wiring circuit board which can meet environmental requirements.

While the invention has been described in detail and with reference to specific embodiments thereof, it will be apparent to one skilled in the art that various changes and modifications can be made therein without departing from the spirit and scope thereof.

What is claimed is:

1. An epoxy resin composition comprising:
   (i) an epoxy resin having a melt viscosity of from 0.1 dPa to 5 dPa at 1 500° C. and having two or more repeating units each comprising:
   a methylene group substituted by at least an aromatic ring; and
   a benzene ring substituted by at least a glycidyloxy group, wherein said aromatic ring is a combination of aromatic rings in which two or more aromatic monocycles or condensed aromatic rings are connected directly to each other via a single bond; and
   (ii) a curing agent.

2. The epoxy resin composition according to claim 1, wherein said epoxy resin is represented by the following general formula (1):

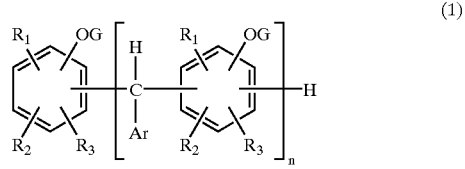

wherein $R_1$ to $R_3$ may be the same or different and each represent a hydrogen atom, a $C_1$–$C_6$ alkyl group, a $C_5$–$C_6$ cycloalkyl group, a $C_1$–$C_6$ alkoxyl group, a $C_5$–$C_6$ cycloalkoxyl group, a phenyl group, a phenoxy group or a glycidyloxyphenyl group; Ar is a hydrocarbon group having a member selected from the group consisting of a combination of two or more $C_6$–$C_{18}$ aromatic monocycles connected directly to each other via a single bond, and combinations of two or more $C_6$–$C_{18}$ condensed aromatic rings connected directly to each other via a single bond; n represents the number of repeating units ranging from 2 to 15; and G represents a glycidyl group.

3. The epoxy resin composition according to claim 1, wherein said epoxy resin is represented by the following general formula (2):

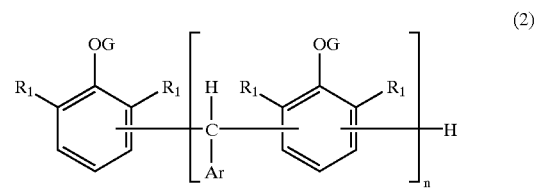

wherein $R_1$ represents a hydrogen atom, a $C_1$–$C_6$ alkyl group, a $C_5$–$C_6$ cycloalkyl group, a alkoxyl group, a $C_5$–$C_6$ cycloalkoxyl group, a phenyl group, a phenoxy group or a glycidyloxyphenyl group; Ar represents a hydrocarbon group having a member selected from the group consisting of a combination of two or more $C_6$–$C_{18}$ aromatic monocycles connected directly to each other via a single bond, and combinations of two or more $C_6$–$C_{18}$ condensed aromatic rings connected directly to each other via a single bond; n represents the number of repeating units ranging from 2 to 15; and G represents a glycidyl group.

4. The epoxy resin composition according to claim 3, wherein Ar is biphenyl.

5. The epoxy resin composition according to any one of claims 1 to 4, wherein said curing agent comprises an aromatic hydroxyl group-containing compound having hydroxyl group-containing aromatic nuclei connected to each other via a hydroxyl group-free aromatic skeleton-containing group as a knot group.

6. The epoxy resin composition according to claim 5, wherein said aromatic hydroxyl group-containing compound is a phenolaralkyl resin.

7. A cured product obtained by curing an epoxy resin composition according to any one of claims 1 to 4.

* * * * *